US008298958B2

(12) United States Patent
Adams et al.

(10) Patent No.: US 8,298,958 B2
(45) Date of Patent: Oct. 30, 2012

(54) ORGANIC LINE WIDTH ROUGHNESS WITH H₂ PLASMA TREATMENT

(75) Inventors: Yoko Y. Adams, Union City, CA (US); David Yang, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 1004 days.

(21) Appl. No.: 12/175,153

(22) Filed: Jul. 17, 2008

(65) Prior Publication Data

US 2010/0015809 A1  Jan. 21, 2010

(51) Int. Cl.
*H01L 21/302* (2006.01)
(52) U.S. Cl. ......... 438/717; 438/725; 438/734; 438/736
(58) Field of Classification Search .................. 438/717, 438/725, 734, 736
See application file for complete search history.

(56) References Cited

U.S. PATENT DOCUMENTS

| | | |
|---|---|---|
| 6,326,307 B1 | 12/2001 | Lindley et al. |
| 6,720,247 B2 | 4/2004 | Kirkpatrick et al. |
| 6,811,956 B1 * | 11/2004 | Gabriel .......... 430/313 |
| 6,923,920 B2 | 8/2005 | Taylor et al. |
| 6,949,460 B2 | 9/2005 | Wagganer et al. |
| 7,022,611 B1 | 4/2006 | Keil et al. |
| 7,053,003 B2 | 5/2006 | Kanarik et al. |
| 7,122,480 B2 | 10/2006 | Li et al. |
| 7,196,014 B2 | 3/2007 | Dalton et al. |
| 7,196,017 B2 | 3/2007 | Mirkarimi et al. |
| 7,373,216 B1 | 5/2008 | Winkler et al. |
| 2006/0037703 A1 | 2/2006 | Koshiishi et al. |
| 2006/0040502 A1 | 2/2006 | Fukumizu et al. |
| 2006/0078820 A1 | 4/2006 | Fedynyshyn |
| 2006/0094221 A1 * | 5/2006 | Soda et al. .......... 438/597 |
| 2006/0154184 A1 | 7/2006 | Mahorowala et al. |
| 2006/0205223 A1 | 9/2006 | Smayling |
| 2007/0114205 A1 | 5/2007 | Kwon et al. |
| 2007/0181530 A1 | 8/2007 | Huang et al. |
| 2007/0287298 A1 | 12/2007 | Ishibashi et al. |
| 2007/0298615 A1 | 12/2007 | Matsuzawa et al. |
| 2008/0014533 A1 | 1/2008 | Keller et al. |
| 2008/0029483 A1 * | 2/2008 | Ventzek et al. .......... 216/58 |
| 2008/0032507 A1 | 2/2008 | Ventzek et al. |

(Continued)

FOREIGN PATENT DOCUMENTS

WO  WO02/080239  10/2002

(Continued)

OTHER PUBLICATIONS

International Search Report dated Jan. 26, 2010 from International Application No. PCT/US2009/049793.

(Continued)

*Primary Examiner* — Binh X Tran
(74) *Attorney, Agent, or Firm* — Beyer Law Group LLP (57) ABSTRACT

A method for reducing very low frequency line width roughness (LWR) in forming etched features in an etch layer disposed below a patterned organic mask is provided. The patterned organic mask is treated to reduce very low frequency line width roughness of the patterned organic mask, comprising flowing a treatment gas comprising $H_2$, wherein the treatment gas has a flow rate and $H_2$ has a flow rate that is at least 50% of the flow rate of the treatment gas, forming a plasma from the treatment gas, and stopping the flow of the treatment gas. The etch layer is etched through the treated patterned organic mask with the reduced very low LWR.

16 Claims, 10 Drawing Sheets

U.S. PATENT DOCUMENTS

2008/0045011 A1    2/2008   Fuller et al.
2008/0215274 A1*   9/2008   Yamaguchi et al. ............ 702/82

FOREIGN PATENT DOCUMENTS

WO    WO2006/011996    2/2006

OTHER PUBLICATIONS

Written Opinion dated Jan. 26, 2010 from International Application No. PCT/US2009/049793.

Kim et al., "Effects of various plasma pretreatments on 193 nm photoresist and linewidth roughness after etching", J. Vac. Sci. Technol. B, 24(6), 2006, pp. 2645-2652.

Yonekura et al., "Suppression of 193-nm photoresist deformation by H2 addition to fluorocarbon plasma in via-hole etching", Thin Solid Films 515, 2007, pp. 5012-5018.

Bhatnagar et al., "Integrated non-SO2 underlayer and improved line-edge-roughness dielectric etch process using 193 nm bilayer resist", Applied Physics Letters, vol. 88, Issue 23, id. 231501, 2006, 2 pages.

Kawahira et al., "Changes of Chemical Nature of Photoresists Induced by Various Plasma Treatments and Their Impact on LWR," Advances in Resist Technology and Processing XXII, Proceedings of SPIE, vol. 6153, pp. 615319 (1-10), 2006.

Mahorowala et al., "Line edge roughness reduction by plasma curing photoresists," Advances in Resist Technology and Processing XXII, Proceedings of SPIE, vol. 5753, pp. 380-389, 2005.

\* cited by examiner

INTERNAL WAFER-ADI

FIG. 5A

INTERNAL WAFER-POST FLASH

ORGANIC LINE WIDTH ROUGHNESS WITH $H_2$ PLASMA TREATMENT

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

SUMMARY OF THE INVENTION

To achieve the foregoing and in accordance with the purpose of the present invention, a method for reducing very low frequency line width roughness (LWR) in forming etched features in an etch layer disposed below a patterned organic mask is provided. The patterned organic mask is treated to reduce very low frequency line width roughness of the patterned organic mask, comprising flowing a treatment gas comprising $H_2$, wherein the treatment gas has a flow rate and $H_2$ has a flow rate that is at least 50% of the flow rate of the treatment gas, forming a plasma from the treatment gas, and stopping the flow of the treatment gas. The etch layer is etched through the treated patterned organic mask with the reduced very low LWR.

In another manifestation of the invention a method for reducing very low frequency line width roughness (LWR) in forming etched features in a conductive layer disposed below a hard mask layer disposed below an etch layer disposed below a patterned photoresist mask forming a stack on a wafer is provided. The wafer is placed in a process chamber. The patterned photoresist mask is treated to reduce very low frequency line width roughness of the patterned photoresist mask, comprising flowing a treatment gas comprising $H_2$, wherein the treatment gas has a flow rate and $H_2$ has a flow rate that is at least 50% of the flow rate of the treatment gas into the process chamber, forming a plasma from the treatment gas, and stopping the flow of the treatment gas. The etch layer is etched through the treated patterned photoresist mask. The hard mask layer is etched through the etched layer. The conductive layer is etched through the hard mask layer. The wafer is removed from the process chamber, so that the treating the patterned organic mask, etching the etch layer, etching the hard mask layer, and etching the conductive layer are all done in situ in the same process chamber.

In another manifestation of the invention an apparatus for reducing very low frequency line width roughness (LWR) in forming etched features in an etch layer, disposed below a patterned organic mask with mask features is provided. A plasma processing chamber is provided, comprising a chamber wall forming a plasma processing chamber enclosure, a substrate support for supporting a wafer within the plasma processing chamber enclosure, a pressure regulator for regulating the pressure in the plasma processing chamber enclosure, at least one antenna for providing inductively coupled power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet and comprises an etchant gas source and a $H_2$ treatment gas source. A controller is controllably connected to the gas source and the at least one antenna and comprises at least one processor and computer readable media. The computer readable media comprises computer readable code for treating the patterned organic mask to reduce very low frequency line width roughness of the patterned organic mask, comprising computer readable code for flowing a treatment gas comprising $H_2$, wherein the treatment gas has a flow rate and $H_2$ has a flow rate that is at least 50% of the flow rate of the treatment gas, computer readable code for forming a plasma from the treatment gas, and computer readable code for stopping the flow of the treatment gas, and computer readable code for etching the etch layer through the treated patterned organic mask with the reduced very low LWR.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
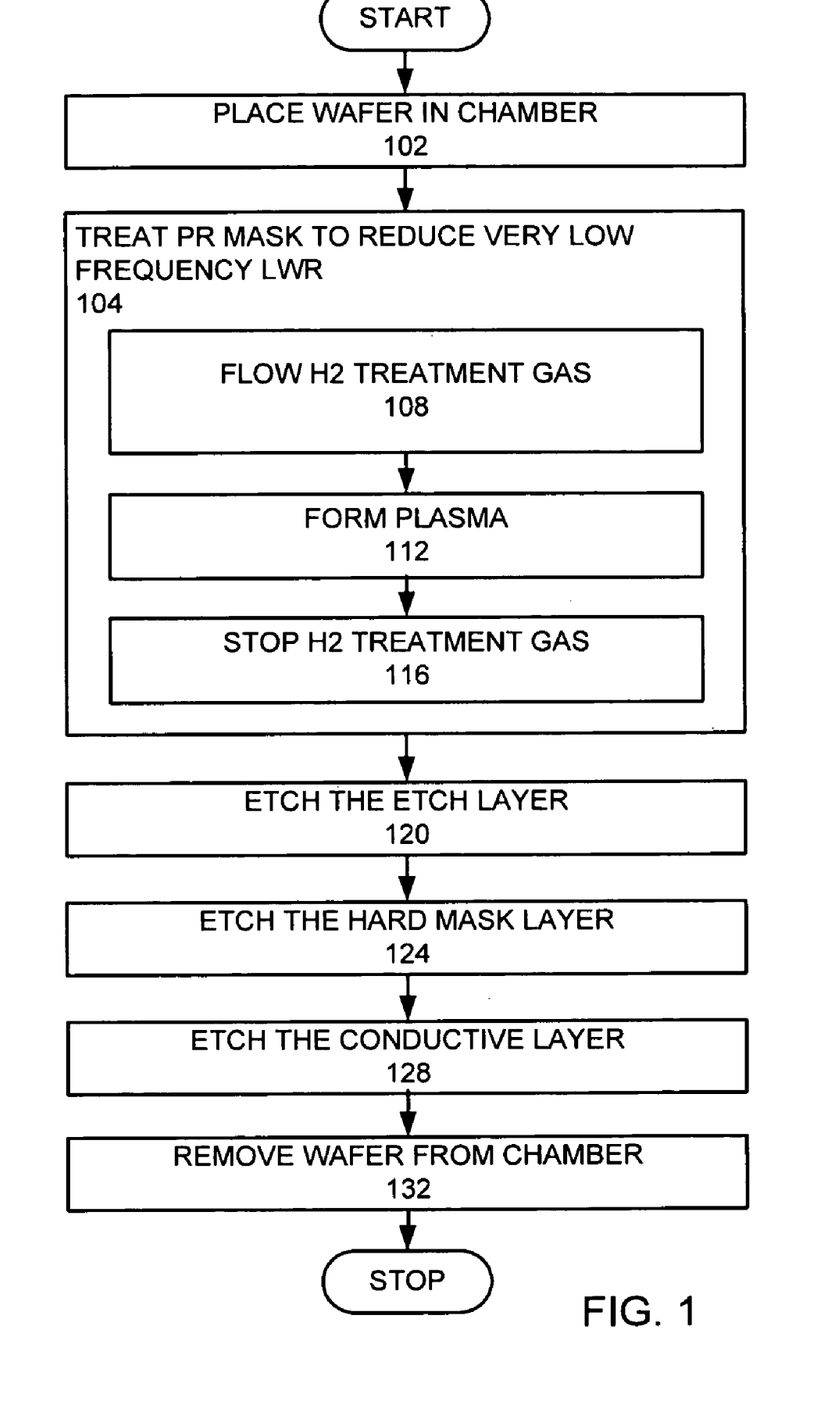
FIG. 1 is a high level flow chart of a process that may be used in an embodiment of the invention.

To facilitate understanding, FIG. 1 is a high level flow chart of a process that may be used in an embodiment of the invention, which reduces very low frequency line width roughness below a patterned photoresist mask. A wafer with a patterned photoresist mask is placed into an inductively coupled TCP chamber (step 102). The patterned photoresist mask is treated to reduce very low frequency line width roughness (LWR) (step 104). This step comprises flowing a H₂ treatment gas into a process chamber (step 108), forming a plasma from the H₂ treatment gas (step 112), which reduces the very low frequency line width roughness. Subsequent processing steps may be performed to complete the structure. The flow of the H₂ treatment gas is stopped (step 116) to stop the treatment process. For example, in one embodiment an etch layer is etched (step 120) after the PR treatment. In this embodiment, the etch layer is an organic ARC layer, which is above a hard mask layer, which is above a conductive layer. The hard mask is then opened (step 124). The conductive layer is etched (step 128). The wafer is removed from the process chamber (step 132).

Example

Figure 2A:
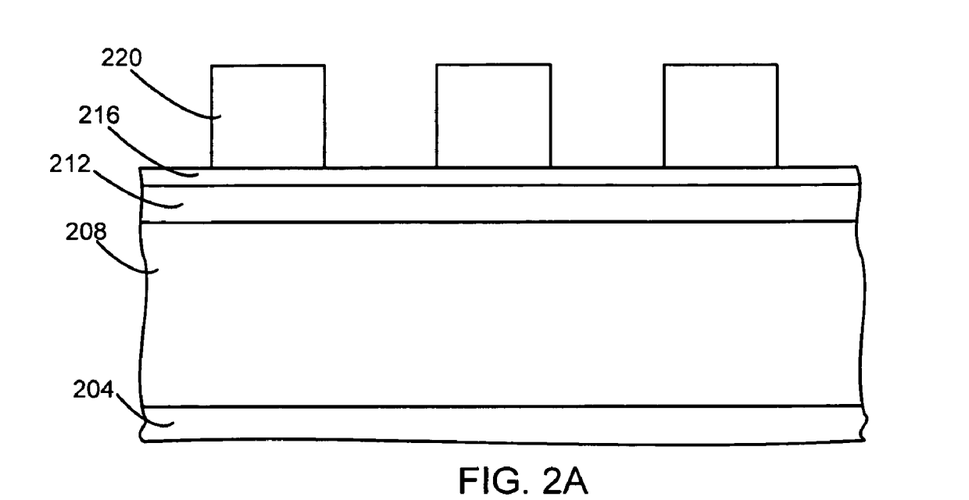
FIGS. 2A-C are schematic cross-sectional views of a stack etched according to an embodiment of the invention.

In an example of an implementation of the invention, a wafer is provided with an etch layer and a photoresist mask. FIG. 2A is a cross-sectional view of an example of a wafer 204 over which a conductive layer 208 is formed, over which a hard mask layer 212 is formed, over which an organic antireflective coating (ARC) layer 216 is formed, over which a patterned PR mask 220 is formed. In this example, the patterned PR mask 220 is of a 193 nm or higher generation photoresist material. The organic ARC layer 216 may be a BARC (bottom antireflective coating) material. The hard mask layer 212 may be one or more layers of different materials, such as $SiO_x$ or $SiN_x$. The conductive layer 208 is of a conductive material such as polysilicon, amorphous silicon, or a metal such as TiN. In this example, the wafer 204 is a crystalline silicon wafer.

In this example, the patterned photoresist mask 216 has a very low frequency line edge roughness. A very low frequency line width roughness repetition length of greater than 500 nm. More preferably, the very low line edge roughness repetition length is greater than 550 nm. Line width roughness is the $3\sigma$ value of line width in a given inspection area, which may be calculated according to:

$$LWR = 3 \times \sqrt{\frac{\sum_{i=1}^{n}(CD_i - \overline{CD})^2}{n-1}} \quad \text{(Equation 1)}$$

Figure 7:
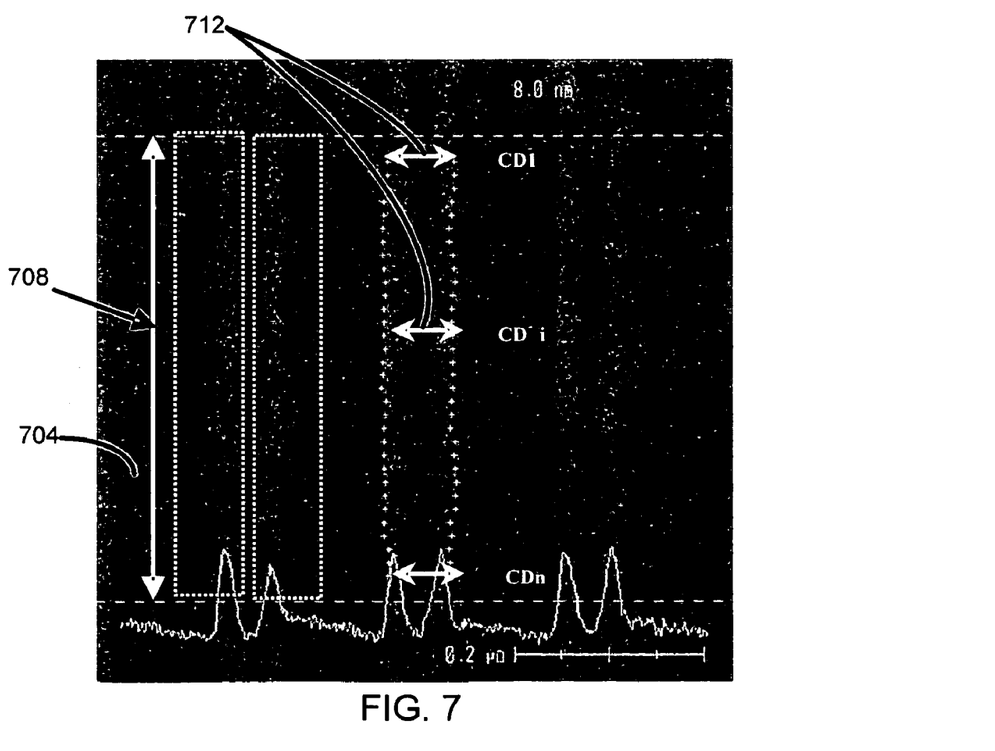
FIG. 7 is a CD-SEM (top-down) of a wafer with a mask that illustrates LWR.

FIG. 7 is a CD-SEM (top-down) of a wafer with a mask 704 that illustrates LWR. An inspection length 708 is selected. Along the inspection length, line widths 712 are measured for a feature extending along the inspection length. The measured line widths 712 are used in equation 1 to calculate LWR.

Figure 8:
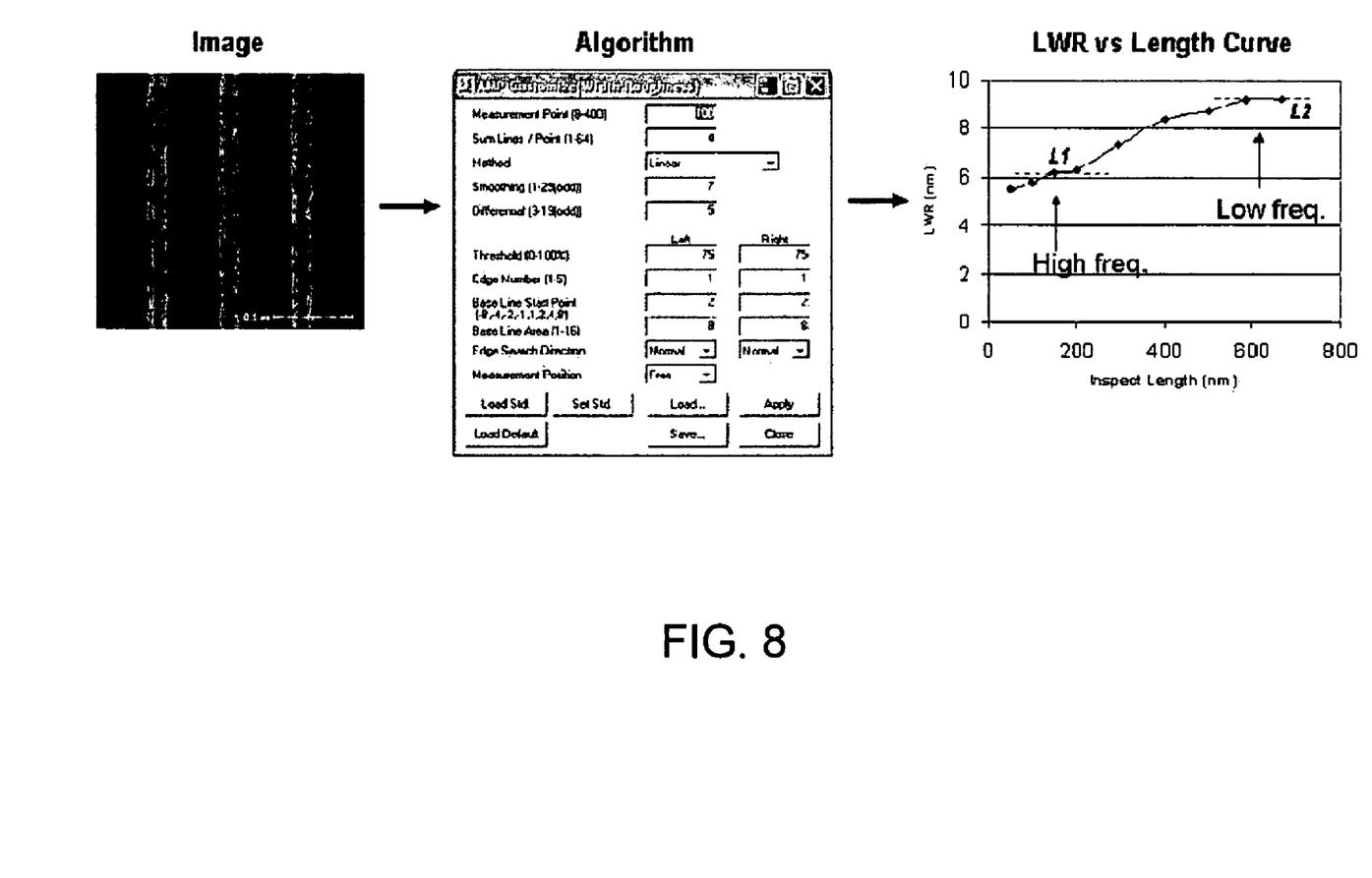
FIG. 8 shows a typical sequence that is followed to obtain the LWR vs inspect length curve.

FIG. 8 shows a typical sequence that is followed to obtain the LWR vs inspect length curve. Following image acquisition from the CD-SEM (top-down), at the optimal focus, beam alignment, and integration, an optimal LWR algorithm is applied to relevant features in the image. The variation of LWR is studied as a function of inspect length and the result is a curve that shows the high- and very low-frequency LWR components. The regions where the LWR curve flattens out (at two locations, inspect length ~200 nm and ~600 nm) correspond to the amplitudes of the high- and very low-frequency LWR, respectively.

The wafer 204 is placed in an inductively coupled plasma processing chamber (step 102).

Figure 3:
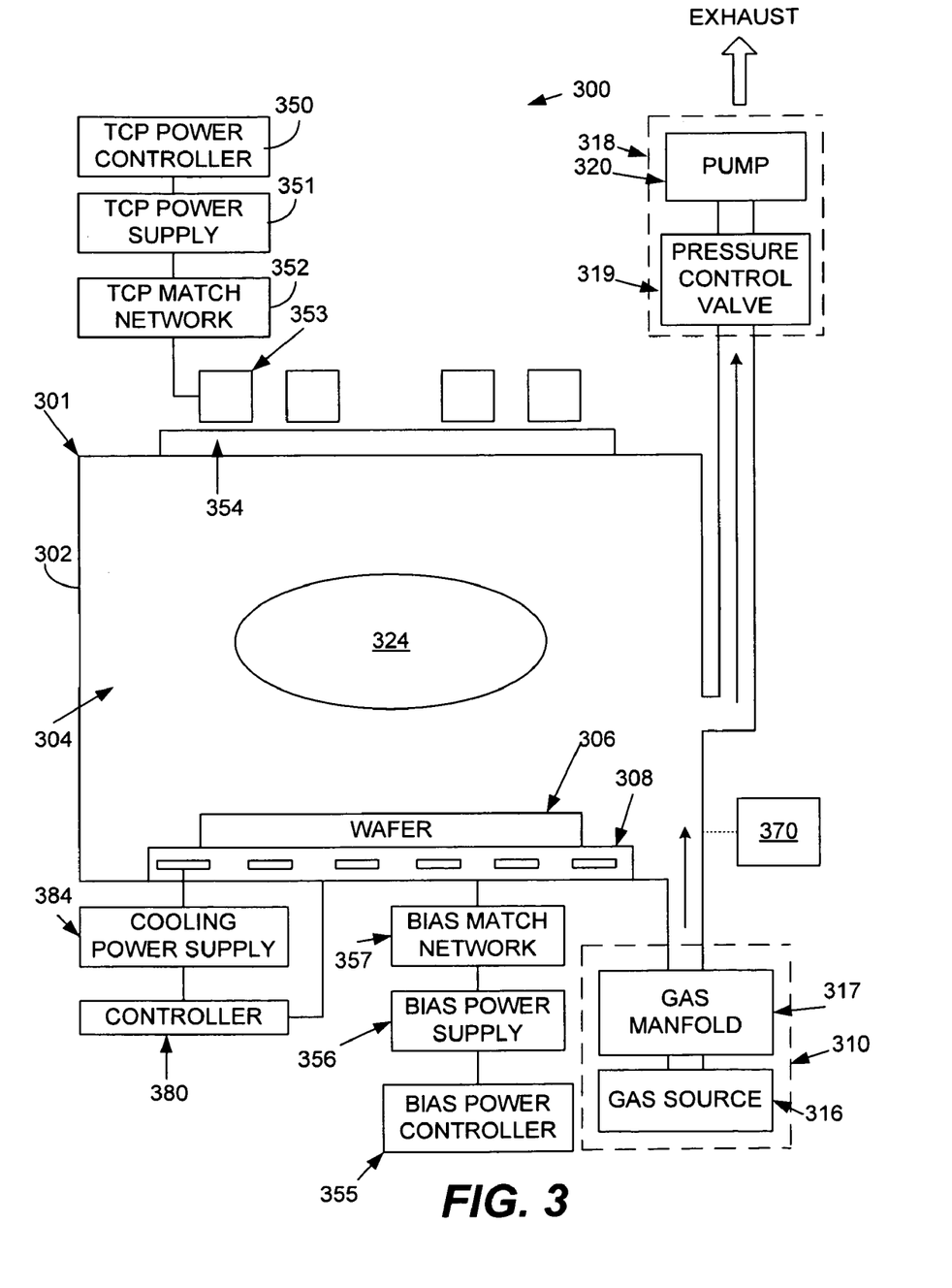
FIG. 3 is a schematic view of a plasma processing chamber that may be used in practicing the invention.

FIG. 3 illustrates a processing tool that may be used in an implementation of the invention. FIG. 3 is a schematic view of a plasma processing system 300, including a plasma processing tool 301. The plasma processing tool 301 is an inductively coupled plasma etching tool and includes a plasma reactor 302 having a plasma processing chamber 304 therein. A transformer coupled power (TCP) controller 350 and a bias power controller 355, respectively, control a TCP power supply 351 and a bias power supply 356 influencing the plasma 324 created within plasma chamber 304.

The TCP power controller 350 sets a set point for TCP power supply 351 configured to supply a radio frequency signal at 13.56 MHz, tuned by a TCP match network 352, to a TCP coil 353 located near the plasma chamber 304. An RF transparent window 354 is provided to separate TCP coil 353 from plasma chamber 304 while allowing energy to pass from TCP coil 353 to plasma chamber 304.

The bias power controller 355 sets a set point for bias power supply 356 configured to supply an RF signal, tuned by bias match network 357, to a chuck electrode 308 located within the plasma chamber 304 creating a direct current (DC) bias above electrode 308 which is adapted to receive a substrate 306, such as a semi-conductor wafer work piece, being processed.

A gas supply mechanism or gas source 310 includes a source or sources of gas or gases 316 attached via a gas manifold 317 to supply the proper chemistry required for the process to the interior of the plasma chamber 304. A gas exhaust mechanism 318 includes a pressure control valve 319 and exhaust pump 320 and removes particles from within the plasma chamber 304 and maintains a particular pressure within plasma chamber 304.

A temperature controller 380 controls the temperature of a cooling recirculation system provided within the chuck electrode 308 by controlling a cooling power supply 384. The plasma processing system also includes electronic control circuitry 370. The plasma processing system may also have an end point detector.

Figure 4A:
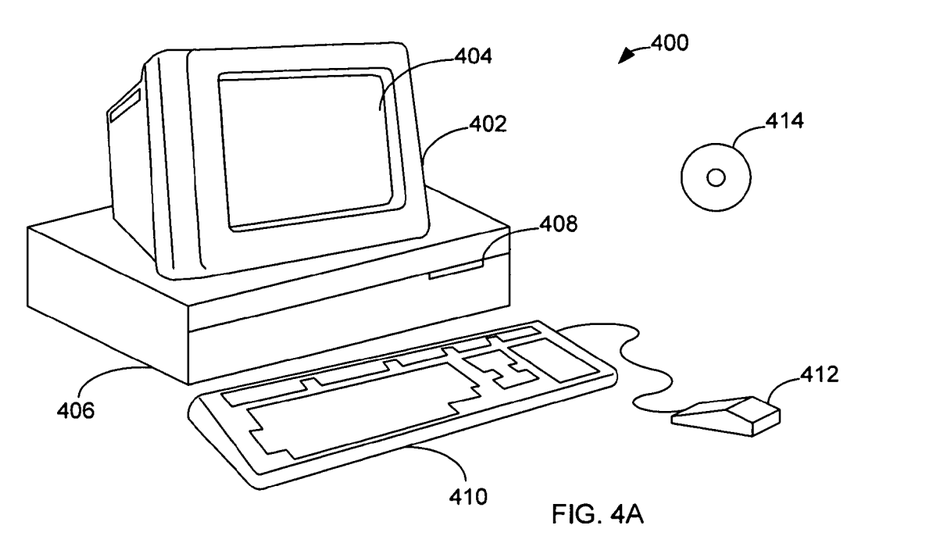
FIGS. 4A-B illustrate a computer system, which is suitable for implementing a controller used in embodiments of the present invention.
Figure 4B:
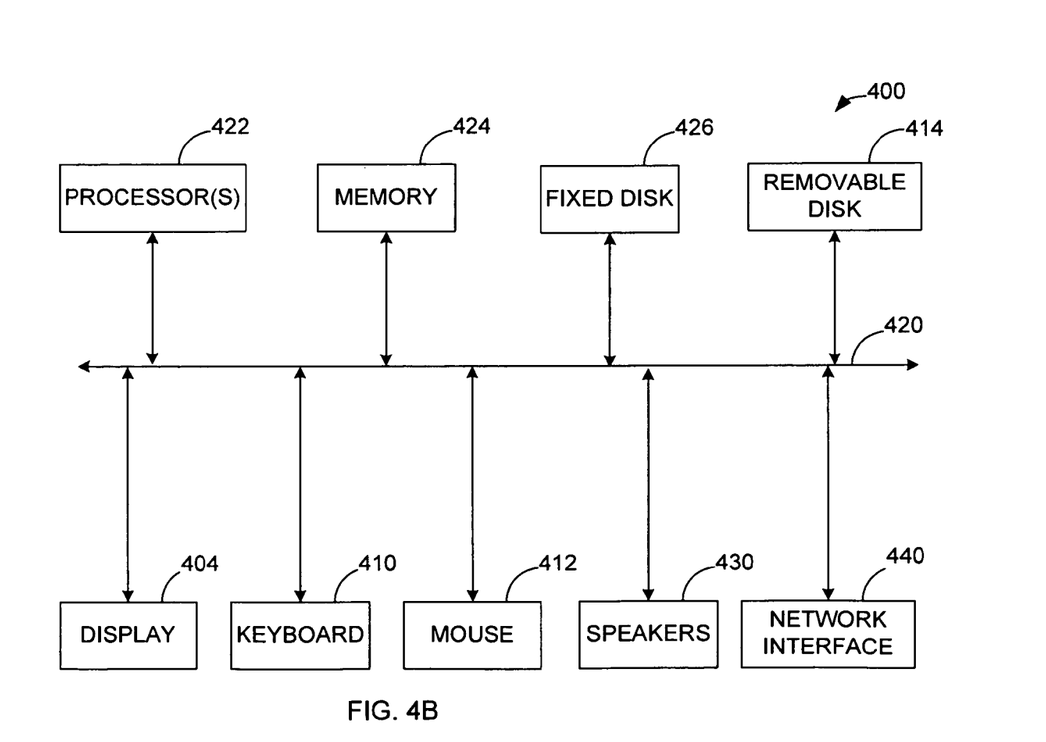

FIGS. 4A and 4B illustrate a computer system 400, which is suitable for implementing a controller for control circuitry 370 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 is also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The patterned PR mask 220 is treated to reduce very low frequency line width roughness (step 104). This is accomplished by first flowing a treatment gas comprising $H_2$ into the process chamber, where the treatment gas has a flow rate and the $H_2$ has a flow rate that is at least 50% of the flow rate of the treatment gas. Preferably, the treatment gas consists essentially of $H_2$ and Ar. More preferably, the treatment gas consists essentially of $H_2$. The treatment is formed into a plasma using a low bias (step 112). Preferably, the bias voltage for the low bias is between 0 to 100 volts. More preferably, the bias voltage for the low bias is between 0 to 50 volts. Most preferably, the bias voltage for low bias is 0 volts. The flow of the treatment step is stopped (step 116), to end the PR mask treatment.

A specific example of a treatment recipe provides an $H_2$ treatment gas of 100 sccm $H_2$ and 100 sccm Ar at a pressure of 10 mT. Ranges of the treatment gas in this example recipe may provide 50-500 sccm $H_2$ and 0-500 sccm Ar, at pressures between 2-40 mT. The power provided to form a plasma from the treatment gas is 200-1500 W at 13.56 MHz. More specifically, the power is 1000 W. The bias voltage is 0 volts. An electrostatic chuck temperature of 60° C. is provided. The treatment process is maintained for 5-60 seconds.

Figure 5A:
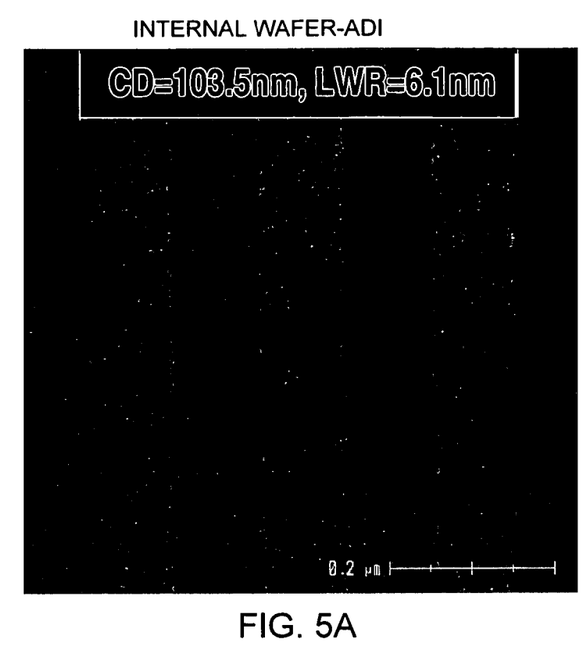
FIGS. 5A-F are CD-SEMs of wafers processed by examples of embodiments of the invention.
Figure 5B:
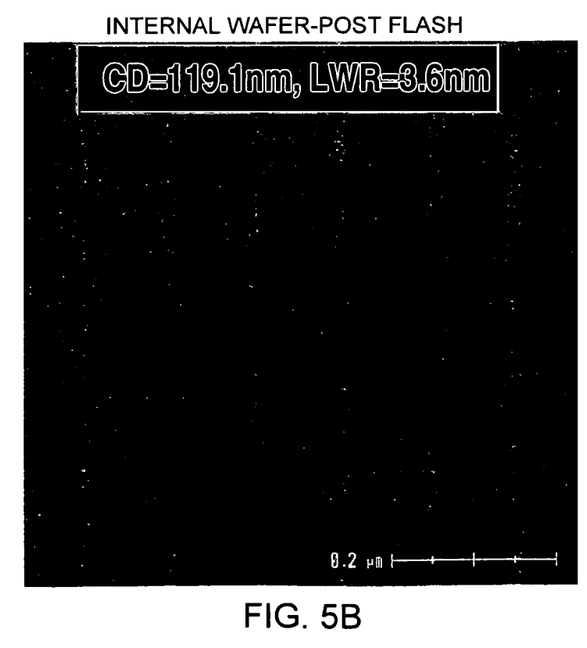

FIGS. 5A-F are CD-SEM (top-down) of wafers of various examples. FIG. 5A is a CD-SEM of a wafer before treatment. The CD of the wafer is 103.5 nm. The very low frequency LWR is 6.1 nm. FIG. 5B is the CD-SEM of the wafer of FIG. 5A after the treatment process. The CD is 119.1 nm with a very low frequency LWR of 3.6 nm. Therefore, the very low LWR was reduced by the plasma treatment. FIG. 6A is a graph of the LWR reduction by the plasma treatment versus inspection length for the wafer of FIG. 5B. The inspection length is related to the LWR frequency.

Figure 5C:
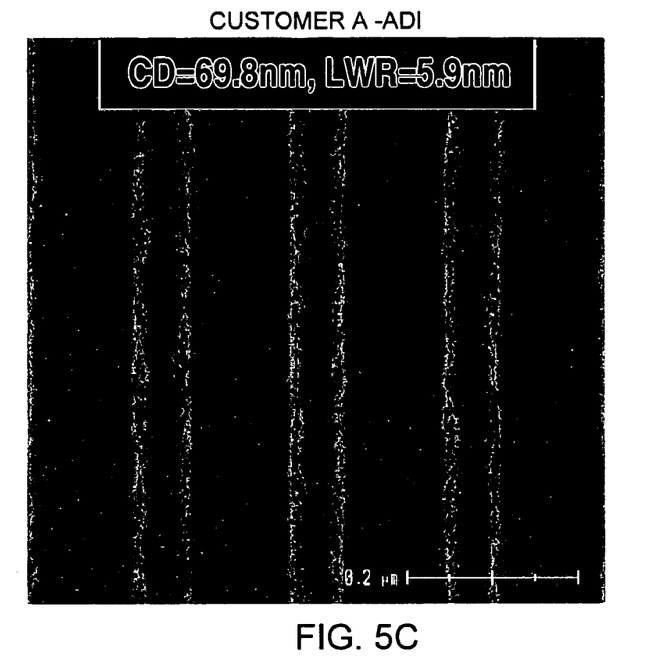
Figure 5D:
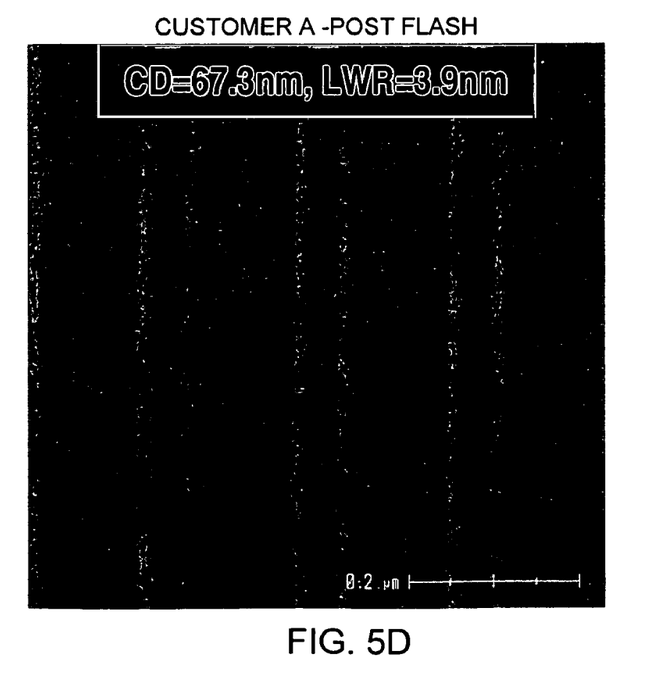
Figure 6A:
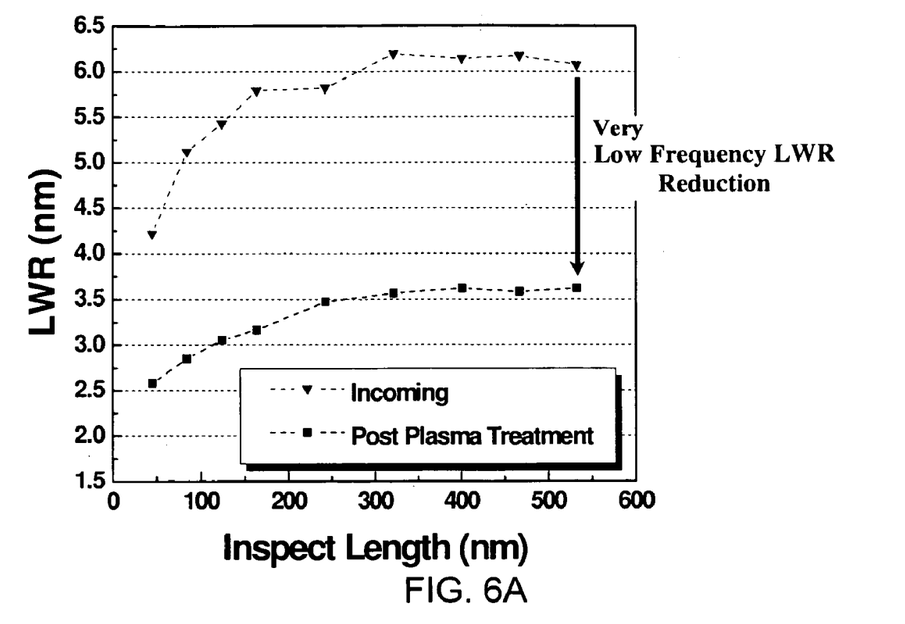
FIGS. 6A-C are graphs of results from the above examples of embodiments of the invention.
Figure 6B:
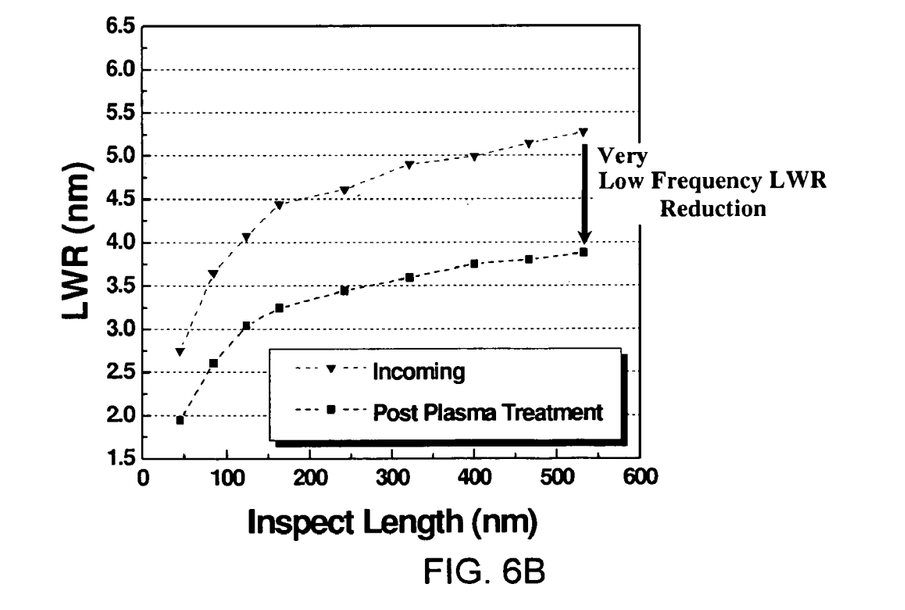

FIG. 5C is a CD-SEM of another type of wafer before treatment. The CD of the wafer is 69.8 nm. The very low frequency LWR is 5.9 nm. FIG. 5D is the CD-SEM of the wafer of FIG. 5C after the treatment process. The CD is 67.3 nm with a very low frequency LWR of 3.9 nm. Therefore, the very low LWR was reduced by the plasma treatment. FIG. 6B is a graph of the LWR reduction by the plasma treatment versus inspection length for the wafer of FIG. 5D.

Figure 5E:
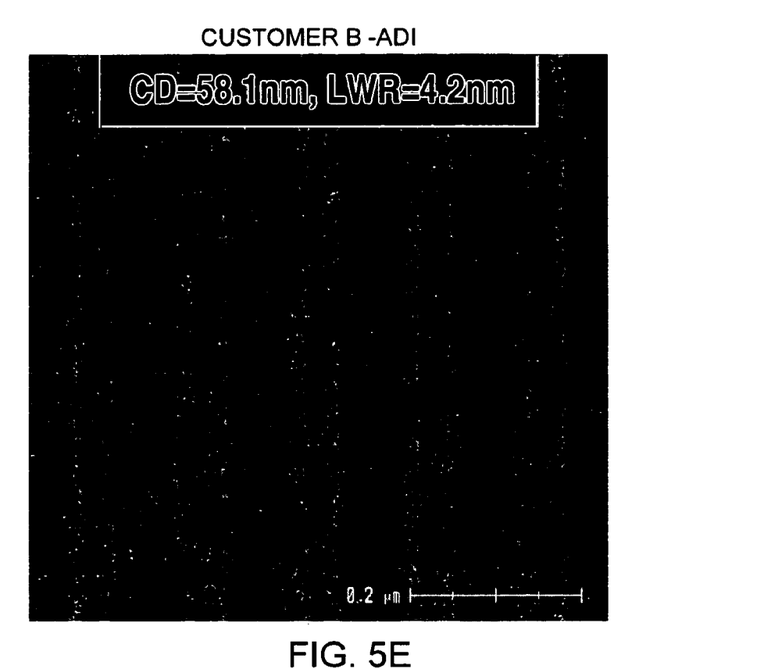
Figure 5F:
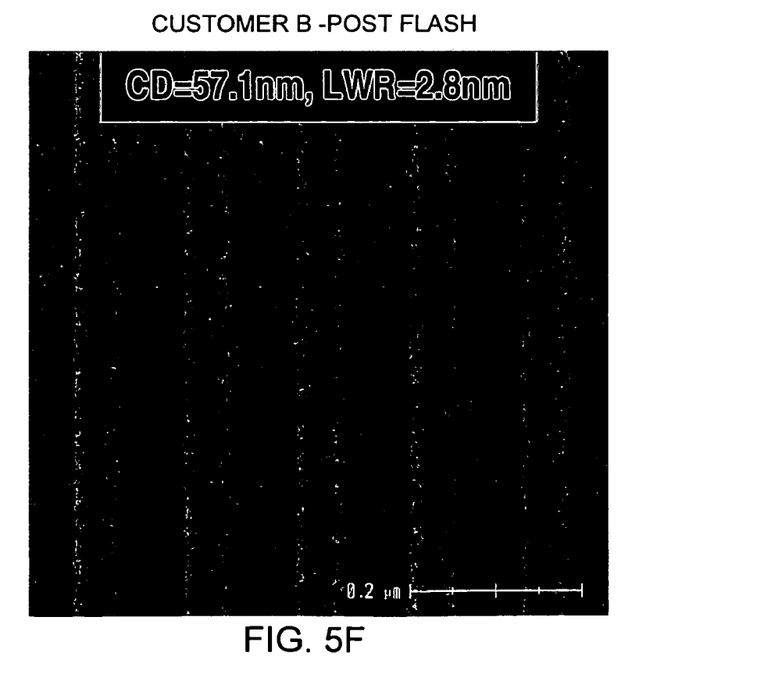
Figure 6C:
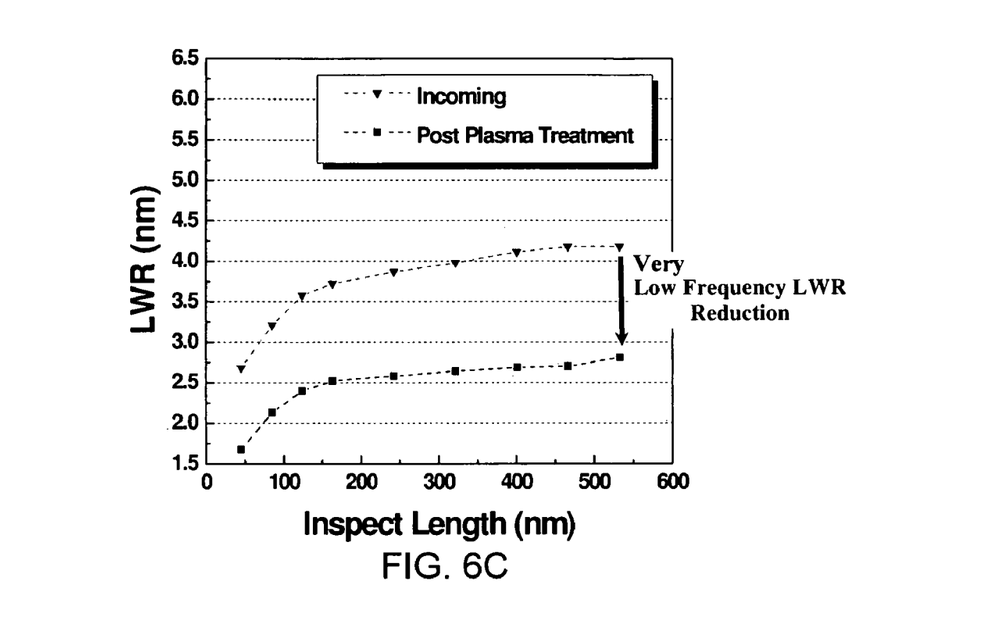

FIG. 5E is a CD-SEM of another type of wafer before treatment. The CD of the wafer is 58.1 nm. The very low frequency LWR is 4.2 nm. FIG. 5F is the CD-SEM of the wafer of FIG. 5E after the treatment process. The CD is 57.1 nm with a very low frequency LWR of 2.8 nm. Therefore, the very low LWR was reduced by the plasma treatment. FIG. 6C is a graph of the LWR reduction by the plasma treatment versus inspection length for the wafer of FIG. 5F.

Figure 2B:
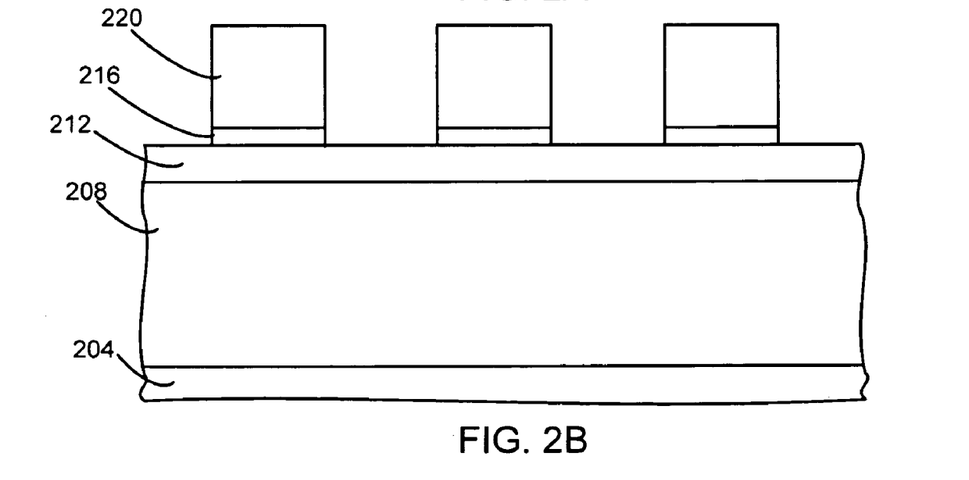
Figure 2C:
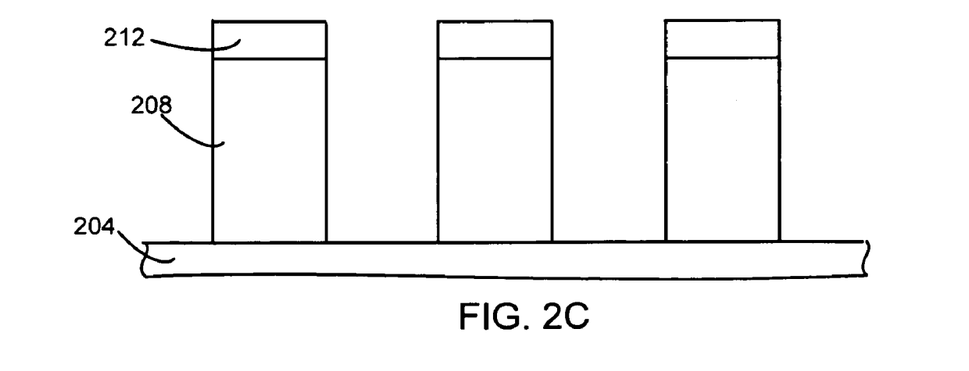

The organic ARC layer 216 is then etched (step 120), using a conventional organic ARC open process based on the specific material of the etch layer. FIG. 2B is a schematic view of the stack after the organic ARC layer 216 has been etched. The hard mask layer 212 may be subsequently etched using the patterned PR mask 220 and/or the organic ARC layer 216 as a patterned mask. The conductive layer 208 may be etched using a conventional conductive layer etch, using the hard mask layer 212 as a patterned mask (step 128) During these process, the photoresist mask and organic ARC may be stripped away. FIG. 2C is a schematic view of the stack after the conductive layer 208 and the hard mask 212 have been etched, where the PR mask and organic ARC have been stripped away. Other processes may be used to further form semiconductor devices. The wafer is then removed from the inductively coupled TCP process chamber (step 132). Therefore, this example of the invention performs treatment to reduce very low frequency LWR, organic ARC open, hard mask open and conductive layer etch in situ in a single inductively coupled plasma process chamber. In this embodiment the organic ARC layer 216 is the etch layer that is etched after the $H_2$ treatment.

Without being bound by theory, it was thought that very low frequency line edge roughness with a repetition rate greater than 500 nm, preferably 550 nm, in a patterned photoresist mask could not be reduced. It was unexpectedly found that an $H_2$ plasma treatment with low bias voltage would reduce very low frequency line width roughness.

Other Embodiments

In other embodiments the $H_2$ treatment to reduce very low frequency LWR may be performed on other patterned organic masks. For example, an organic ARC layer that has been opened using a conventional process may have very low frequency LWR. The $H_2$ treatment may then be applied to the opened organic ARC layer to reduce the very low frequency LWR. In such an example, instead of the organic ARC layer being the etch layer, the hard mask layer is the etch layer that is etched subsequent to the $H_2$ treatment.

In other embodiment a high bias power may be used during the $H_2$ treatment. In other embodiments the etch layer or other layers under the etch layer may be dielectric layers. Such embodiments may have an ARC layer or may not have an ARC layer or may have one or more additional layers. Such embodiments may or may not have a conductive layer and/or a hard mask layer. If the etch layer is a dielectric layer, an embodiment may use a capacitively coupled process chamber instead of an inductively coupled process chamber. In other embodiments, the treatment may be done in a different chamber than the etching.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for reducing very low frequency line width roughness (LWR) with a roughness repetition length of greater than 500 nm in forming etched features in an etch layer disposed below a patterned organic mask, comprising:
    treating the patterned organic mask to reduce very low frequency line width roughness with a roughness repetition length of greater than 500 nm of the patterned organic mask, comprising:
        flowing a treatment gas comprising $H_2$, wherein the treatment gas has a flow rate and $H_2$ has a flow rate that is at least 50% of the flow rate of the treatment gas;
        forming a plasma from the treatment gas; and
        stopping the flow of the treatment gas; and
    etching the etch layer through the treated patterned organic mask with the reduced very low LWR.

2. The method, as recited in claim 1, wherein the treatment gas is halogen free.

3. The method, as recited in claim 1, wherein the treatment gas consists essentially of Ar and $H_2$.

4. The method, as recited in claim 1, wherein the forming a plasma uses a low bias between 0 and 100 volts.

5. The method, as recited in claim 4, wherein the treatment gas is halogen free.

6. The method, as recited in claim 4, wherein the treatment gas consists essentially of Ar and $H_2$.

7. The method, as recited in claim 4, wherein the treatment gas consists essentially of $H_2$.

8. The method, as recited in claim 7, wherein the forming a plasma uses no more than 1500 watts of RF power.

9. The method, as recited in claim 8, wherein the low bias is between 0 to 50 volts.

10. The method, as recited in claim 8, wherein the low bias is 0 volts.

11. The method, as recited in claim 10, wherein the very low frequency LWR of the patterned organic mask after treatment is less than the very low frequency LWR before treatment.

12. The method, as recited in claim 11, further comprising:
    placing a wafer with the etch layer and patterned organic mask in a process chamber before the treating the patterned organic mask; and
    removing the wafer from the process chamber after etching the etch layer.

13. The method, as recited in claim 12, wherein the process chamber is an inductively coupled TCP process chamber.

14. The method, as recited in claim 13, wherein the organic mask is a photoresist mask.

15. A method for reducing very low frequency line width roughness (LWR) with a roughness repetition length of greater than 500 nm in forming etched features in an etch layer disposed below a patterned organic mask, wherein a hard mask layer is below the etch layer and a conductive layer is below the hard mask layer, comprising:
    treating the patterned organic mask to reduce very low frequency line width roughness with a roughness repetition length of greater than 500 nm of the patterned organic mask, comprising:
        flowing a treatment gas comprising $H_2$, wherein the treatment gas has a flow rate and $H_2$ has a flow rate that is at least 50% of the flow rate of the treatment gas;
        forming a plasma from the treatment gas;
        stopping the flow of the treatment gas;
    etching the etch layer through the treated patterned organic mask with the reduced very low LWR;
    etching the hard mask layer, and
    etching the conductive layer, before removing the wafer from the process chamber, so that the treating the patterned organic mask, etching the etch layer, etching the hard mask layer, and etching the conductive layer are all done in situ in the same process chamber.

16. A method for reducing very low frequency line width roughness (LWR) with a roughness repetition length of greater than 500 nm in forming etched features in a conductive layer disposed below a hard mask layer disposed below an ARC layer disposed below a patterned photoresist mask forming a stack on a wafer, comprising:
    placing the wafer in a process chamber;
    treating the patterned photoresist mask to reduce very low frequency line width roughness with a roughness repetition length of greater than 500 nm of the patterned photoresist mask, comprising:
        flowing a treatment gas comprising $H_2$, wherein the treatment gas has a flow rate and $H_2$ has a flow rate that is at least 50% of the flow rate of the treatment gas into the process chamber;
        forming a plasma from the treatment gas; and
        stopping the flow of the treatment gas;
    etching the ARC layer through the treated patterned photoresist mask;
    etching the hard mask layer through the ARC layer;
    etching the conductive layer through the hard mask layer; and
    removing the wafer from the process chamber, so that the treating the patterned organic mask, etching the ARC layer, etching the hard mask layer, and etching the conductive layer are all done in situ in the same process chamber.

* * * * *